United States Patent
Yang

(10) Patent No.: US 10,565,427 B2
(45) Date of Patent: Feb. 18, 2020

(54) FINGERPRINT SENSOR PACKAGE AND FABRICATING METHOD THEREOF

(71) Applicant: SHUNSIN TECHNOLOGY (ZHONG SHAN) LIMITED, Zhongshan (CN)

(72) Inventor: Jun Yang, Zhongshan (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 119 days.

(21) Appl. No.: 15/914,022

(22) Filed: Mar. 7, 2018

(65) Prior Publication Data

US 2018/0307889 A1 Oct. 25, 2018

Related U.S. Application Data

(63) Continuation of application No. 15/228,156, filed on Aug. 4, 2016, now Pat. No. 9,953,206.

(30) Foreign Application Priority Data

May 25, 2016 (CN) .......................... 2016 1 0352261

(51) Int. Cl.
| | |
|---|---|
| *G06K 9/00* | (2006.01) |
| *H01L 23/00* | (2006.01) |
| *H05K 1/11* | (2006.01) |
| *H05K 3/36* | (2006.01) |
| *H05K 1/02* | (2006.01) |
| *H05K 1/14* | (2006.01) |
| *H05K 1/18* | (2006.01) |
| *H05K 3/00* | (2006.01) |
| *H05K 3/30* | (2006.01) |
| *H05K 3/32* | (2006.01) |

(52) U.S. Cl.
CPC .......... *G06K 9/00053* (2013.01); *H01L 24/16* (2013.01); *H05K 1/0281* (2013.01); *H05K 1/119* (2013.01); *H05K 1/142* (2013.01); *H05K 1/181* (2013.01); *H05K 3/0044* (2013.01); *H05K 3/303* (2013.01); *H05K 3/328* (2013.01); *H05K 3/361* (2013.01); *H05K 3/363* (2013.01); *H05K 1/117* (2013.01); *H05K 1/189* (2013.01); *H05K 2201/09845* (2013.01); *H05K 2201/10151* (2013.01)

(58) Field of Classification Search
CPC combination set(s) only.
See application file for complete search history.

(56) References Cited

U.S. PATENT DOCUMENTS

| | | |
|---|---|---|
| 5,726,726 A | 3/1998 | Nakanishi |
| 6,924,496 B2 | 8/2005 | Manansala |
| 2009/0184408 A1* | 7/2009 | Okada .................. G06K 9/0002 257/680 |

FOREIGN PATENT DOCUMENTS

| | | |
|---|---|---|
| CN | 104700102 A | 6/2015 |
| TW | M522419 U | 5/2016 |

* cited by examiner

*Primary Examiner* — Ruiping Li
(74) *Attorney, Agent, or Firm* — ScienBiziP, P.C.

(57) ABSTRACT

A fingerprint sensor package includes a substrate, a fingerprint sensor chip, and a flexible printed circuit board (FPC). The substrate includes a first portion and a second portion. A line layer is disposed on the first portion. The fingerprint sensor chip is disposed on the substrate. The fingerprint sensor chip is electrically connected to the FPC by the line layer. The package is simple, reliable, and easy for manufacturing process, reducing materials and processing costs.

10 Claims, 7 Drawing Sheets

FINGERPRINT SENSOR PACKAGE AND FABRICATING METHOD THEREOF

CROSS-REFERENCE TO RELATED APPLICATIONS

The application is a continuation of U.S. application Ser. No. 15/228,156, filed Aug. 4, 2016, which claims priority to Chinese Patent Application No. 201610352261.9 filed on May 25, 2016, the contents of which are incorporated by reference herein.

BACKGROUND

Technical Field

The subject matter herein generally relates to a field of data security, and particularly to a fingerprint sensor package and methods for fabricating the fingerprint sensor package.

Description of Related Art

A fingerprint identification chip improves the security of the terminal end-user products such as smartphones, tablet PCs, etc. It is a complicated and expensive process to etch the conventional fingerprint identification chips to form a conductive layer. The coating layer on the finger contact portion, which is easily scratched or contaminated to cause failure of recognition. The combination lines connected with the chip and the substrate typically expose portions between the chip and the substrate. The chip, the line layer, and substrate must be packaged together before bonding to adjacent layers to avoid electrical connection problems.

BRIEF DESCRIPTION OF THE DRAWINGS

Implementations of the present technology will now be described with reference to the attached figures. Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
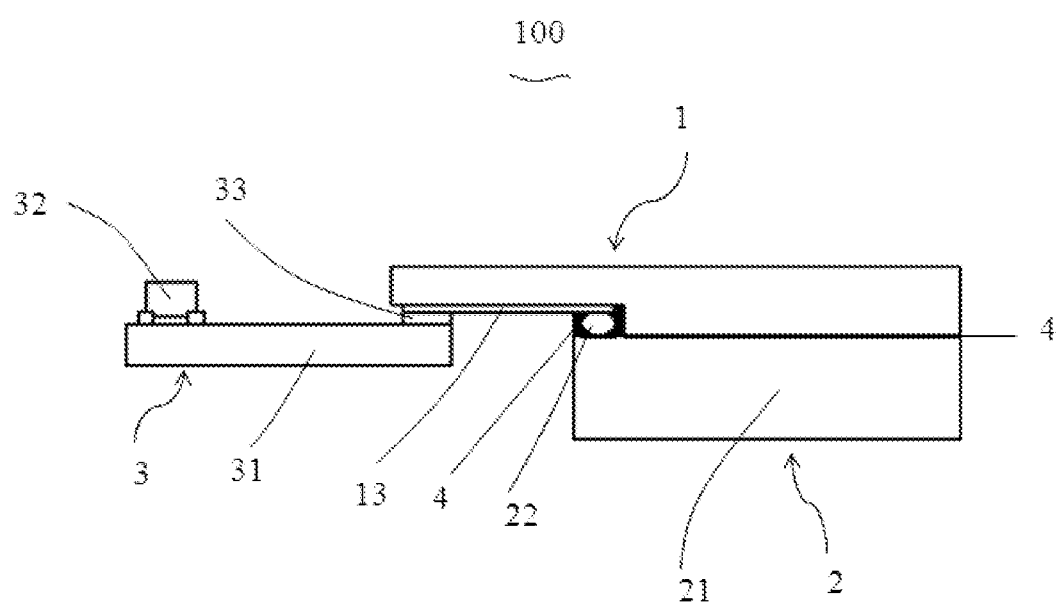
FIG. 1 is an exemplary embodiment of a fingerprint sensor package.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one".

FIG. 1 illustrates a fingerprint sensor package. The fingerprint sensor comprises a substrate 1, a fingerprint sensor chip 2, and a flexible printed circuit board (FPC) 3. The fingerprint sensor chip 2 is electrically connected to the FPC 3 through a line layer 13 of the substrate 1.

Figure 2:
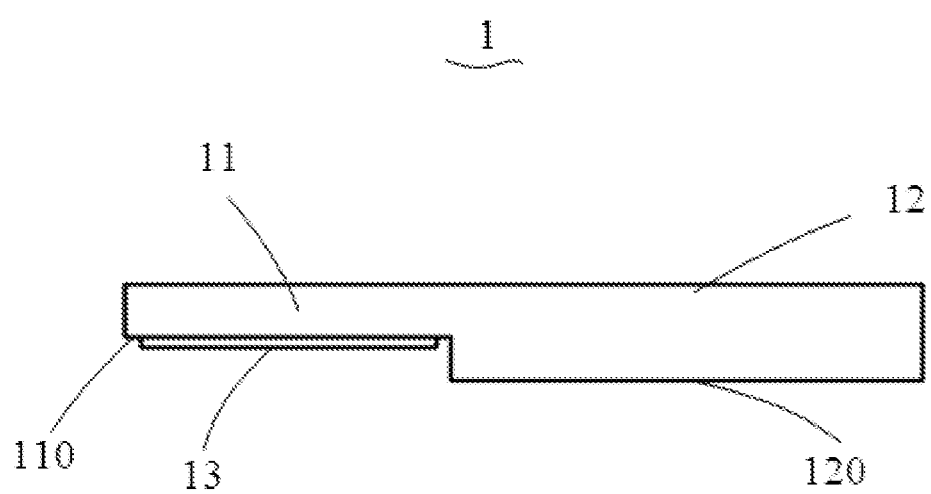
FIG. 2 is an exemplary embodiment of a substrate in the fingerprint sensor package of FIG. 1.

FIG. 2 illustrates a substrate 1. The substrate 1 comprises a first portion 11 and a second portion 12. The length and thickness of the first portion 11 can be less than the length and thickness of the second portion 12. The first portion 11 has a first surface 110, the second portion 12 has a second surface 120, and the first surface 110 is substantially parallel to the second surface 120.

Figure 3:
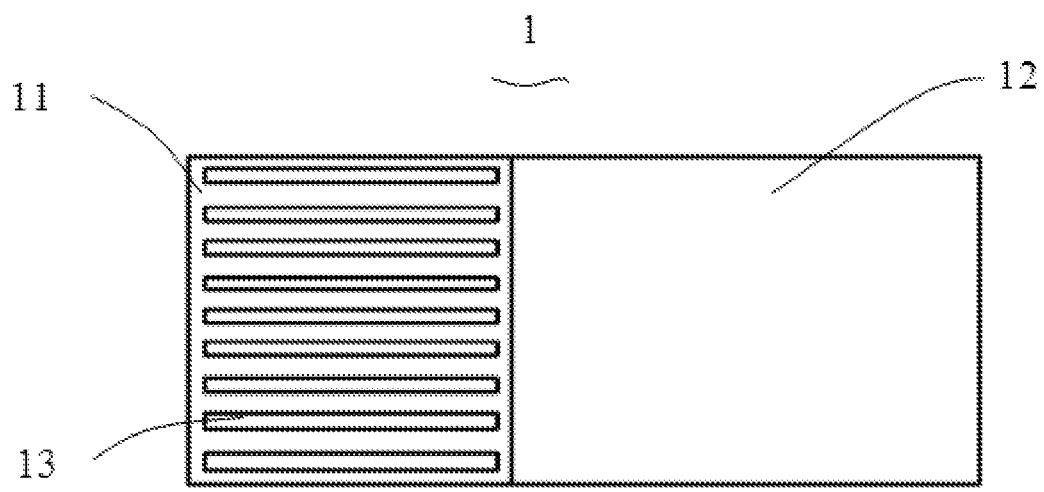
FIG. 3 is the substrate in FIG. 2 as seen from another direction.

FIG. 3 illustrates a bottom-up view of the substrate 1 of FIG. 2. The line layer 13 is distributed on the first surface 110 (shown in FIG. 2) of the first portion 11. The substrate 1 can be made of reinforced glass, sapphire, or ceramic material.

Figure 4:
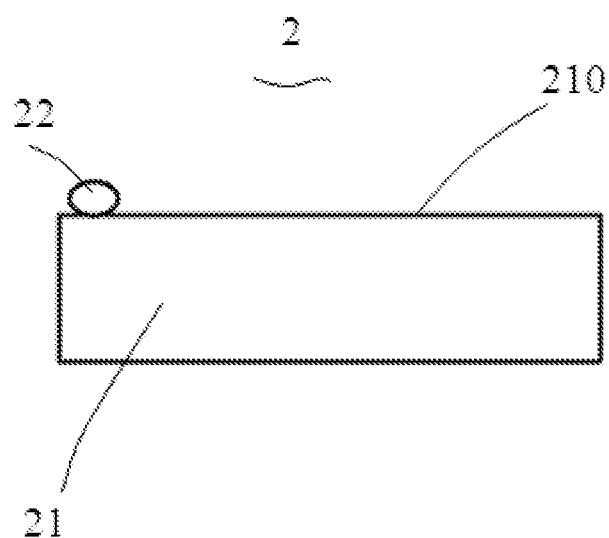
FIG. 4 is an exemplary embodiment of a fingerprint sensor formed with a block in the fingerprint sensor package of FIG. 1.

FIG. 4 illustrates a fingerprint sensor chip 2 including a chip body 21 and a block 22. The chip body 21 has a third surface 210. In the exemplary embodiment, the chip body 21 can be rectangular. The chip body 21 can be any shape. The block 22 is placed on one side of the third surface 210. The block 22 can be a soldering ball or other shapes, the block 22 can be made of a metal or tin alloy, which is conductive.

Figure 5:
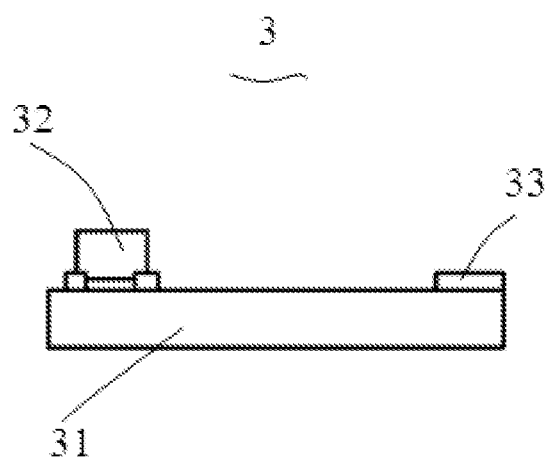
FIG. 5 is an exemplary embodiment of a flexible printed circuit.

FIG. 5 illustrates an FPC 3 including a body 31, a connector 32, and a plurality of SMD components. The connector 32 and the SMD components are soldered on the body 31, and one end of the body 31 forms a soldering point 33.

Figure 6:
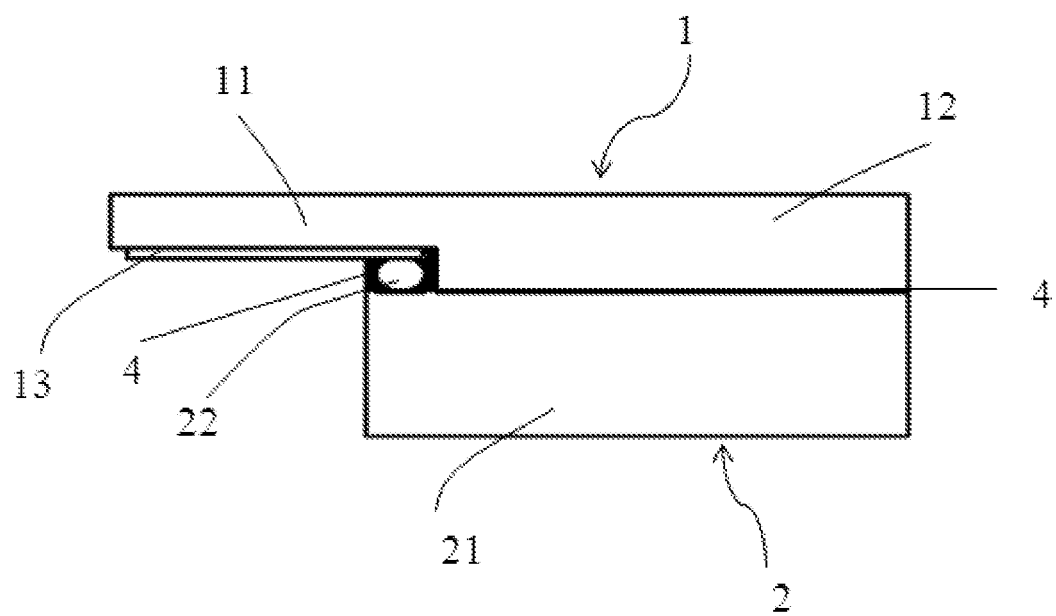
FIG. 6 is an exemplary embodiment of the combined fingerprint sensor chip and the substrate.

FIG. 6 illustrates another fingerprint sensor package. The block 22 of the fingerprint sensor chip 2 extends out from the third surface 210 of the chip body 21 and towards the first surface 110 of the first portion 11. The fingerprint sensor chip 2 can be electrically connected to the line layer 13 through the block 22. The block can be fixed on the first portion 11 by adhesive 4 such as epoxy resin, and part of the third surface 210 can be fixed on the second portion 12 by the adhesive 4.

Referring to FIG. 1, the soldering point 33 of the FPC 3 is soldered with the first portion 11 and the line layer 13. The fingerprint sensor chip 2 is in contact with the line layer 13 by the block 22, and the fingerprint sensor chip 2 is electrically connected to the FPC 3 through the line layer 13.

Figure 7:
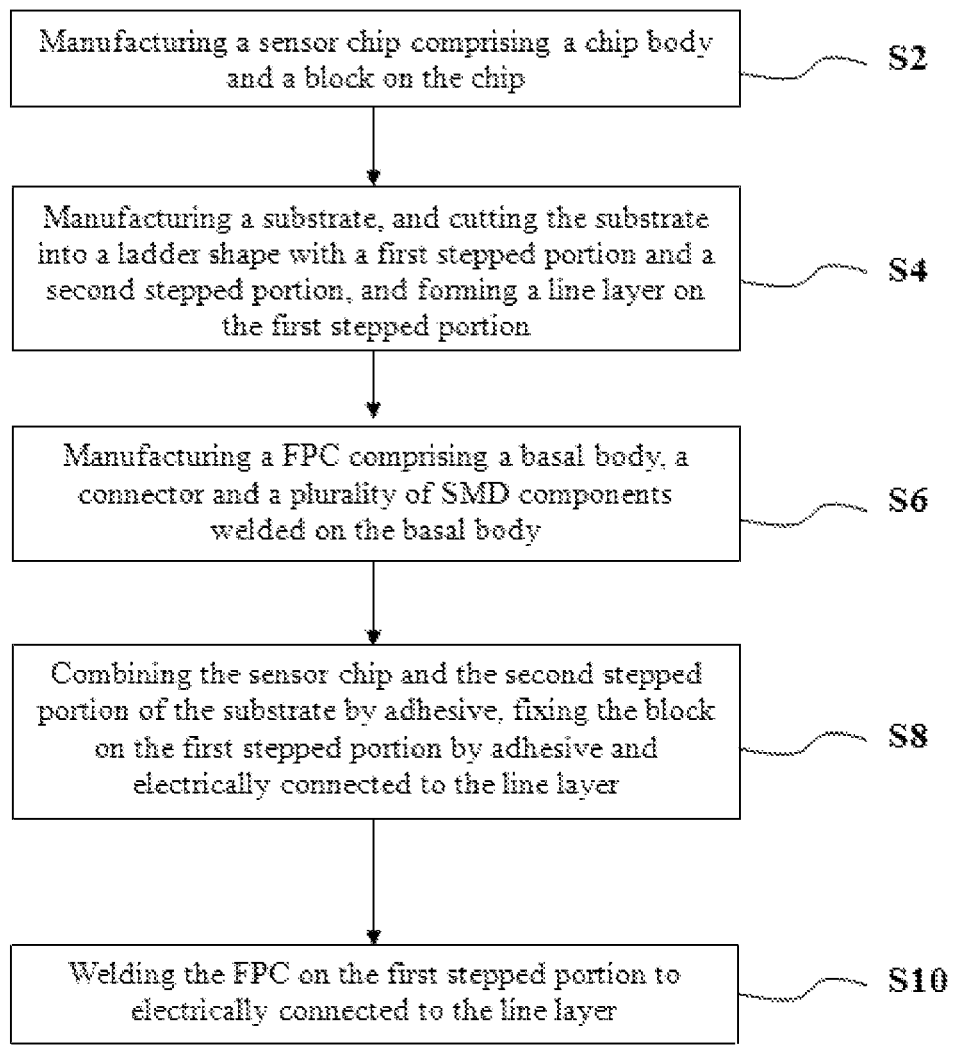
FIG. 7 is a flow chart of a manufacturing process for a fingerprint sensor package.

FIG. 7 is a flowchart illustrating a method for manufacturing a fingerprint sensor package according to various aspects of the present disclosure.

At S2, a fingerprint sensor chip 2 is manufactured. The fingerprint sensor chip 2 has a chip body 21, and a block 22 is made on the chip body 21.

At S4, a substrate 1 is manufactured to includes a first stepped portion 11 and a second stepped portion 12. A line layer 13 is distributed on a first surface 110 of the first stepped portion 11.

At S6, an FPC 3 is manufactured. The FPC 3 has a body 31, a connector 32, and a plurality of SMD components soldered on the body 31.

At S8, Adhesive 4 is used to connect the fingerprint sensor chip 2 and the second portion 12 of the substrate 1. The block 22 extends out from the second portion 12 and is fixed with the first portion 11 by the adhesive 4 to be electrically connected to the line layer 13.

At S10: the FPC 3 is soldered on the first portion 11 to form a solder point 33 electrically connected to the line layer 13.

By the method described in FIG. 7, the FPC 3 is electrically connected to the line layer 13 by the solder point 33 and the fingerprint sensor chip 2 is electrically connected to the line layer 13 by the block 22. Thereby, the fingerprint sensor chip 2 and the FPC 3 are electrically connected.

In an exemplary embodiment, the line layer 13 is positioned on the substrate 1 and the fingerprint sensor chip 2 is electrically connected to the line layer 13 by the block 22. The fingerprint sensor chip 2 does not need to be etched. The line layer 13 is placed on the substrate 1 of reinforced glass and the surface of the fingerprint sensor chip 2 is directly fixed on the substrate 1 by adhesive 4 without packaging. This decreases the thickness of the fingerprint sensor chip 2. The fingerprint sensor uses the reinforced glass instead of coating to avoid scratching, contaminations, etc. The structure of the fingerprint sensor according to an exemplary embodiment of the disclosure is simple and the manufacturing method is fast and affordable. The fingerprint sensor chip receives and detects users' fingers on the substrate made of glass, and the fingerprint sensor chip is electrically connected to a conductor by chip circuit to process the electrical signals output by the conductor.

Although the features and elements of the present disclosure are described as embodiments in particular combinations, each feature or element can be used alone or in other various combinations, within the principles of the present disclosure to the full extent indicated by the broad general meaning of the terms in which the appended claims are expressed.

What is claimed is:

1. A fingerprint sensor package, comprising:
   a substrate having a first portion and a second portion, wherein the first portion has a first surface, and the second portion has a second surface, the first portion is in contact with the second portion and defines a stepped transition, and the first portion and the second portion are on both sides of the stepped transition respectively;
   a fingerprint sensor chip comprising a chip body having a third surface and a block on one side of the third surface;
   a FPC; and
   a line layer disposed on the first portion, wherein the fingerprint sensor chip and the FPC are coupled through the line layer, the block extends out from the third surface and towards the first surface, and the fingerprint sensor chip is electrically connected to the line layer through the block.

2. The fingerprint sensor package of claim 1, wherein the third surface is fixed on the second surface by adhesive, and the block is fixed on the first portion by adhesive.

3. The fingerprint sensor package of claim 1, wherein the FPC comprises a body, a connector and a plurality of surface-mount device components, the connector and the surface-mount device components are welded on the substrate, and one end of the body forms a solder point electrically connected to the line layer.

4. The fingerprint sensor package of claim 1, wherein the substrate is made of reinforced glass, sapphire or ceramic material.

5. The fingerprint sensor package of claim 1, wherein the block is a metal or tin alloy conductive material electrically connected to the line layer.

6. A method of manufacturing fingerprint sensor package, the method comprising:
   providing a fingerprint sensor chip comprising a chip body and a block made on the chip body;
   manufacturing a substrate, and cutting the substrate into a first portion and a second portion, and forming a line layer on the first portion, wherein the first portion is in contact with the second portion and defines a stepped transition, and the first portion and the second portion are on both sides of the stepped transition respectively;
   providing a FPC comprising a body, a connector and a plurality of surface-mount device components welded on the body;
   combining the fingerprint sensor chip with the second portion of the substrate, wherein the block extends out from the second portion and is fixed with the first portion by adhesive to electrically connected to the line layer; and
   electrically connecting the FPC on the first portion to the line layer.

7. The method of claim 6, wherein the fingerprint sensor chip is contacted with the second portion of the substrate by adhesive.

8. The method of claim 6, wherein the FPC is connected on the first portion by welding.

9. The method of claim 6, wherein the substrate is made of reinforced glass, sapphire or ceramic material.

10. The method of claim 6, further comprising electrically connecting the FPC with the line layer through welding with tin or conductive glue; wherein the adhesive is a heat conduction glue, and the block is a metal or tin alloy conductive material.

\* \* \* \* \*